United States Patent [19]
Weng et al.

[11] Patent Number: 5,521,767
[45] Date of Patent: May 28, 1996

[54] OPTIMIZED EQUALIZER SYSTEM FOR DATA RECOVERY AND TIMING EXTRACTION IN PARTIAL RESPONSE READ CHANNELS

[75] Inventors: Lih-Jyh Weng; An-Loong Kok, both of Shrewsbury; Barry H. Gold, Framingham, all of Mass.

[73] Assignee: Quantum Corporation, Milpitas, Calif.

[21] Appl. No.: 406,834

[22] Filed: Mar. 20, 1995

Related U.S. Application Data

[63] Continuation of Ser. No. 123,502, Sep. 17, 1993, abandoned.
[51] Int. Cl.⁶ .............................. G11B 5/09; G11B 5/035; H04L 25/34
[52] U.S. Cl. .................. 360/46; 360/51; 360/65; 375/290
[58] Field of Search ..................... 360/46, 51, 65; 364/602; 375/290, 293, 294, 341, 232, 263

[56] References Cited

U.S. PATENT DOCUMENTS

| | | | |
|---|---|---|---|
| 4,885,646 | 12/1989 | Kanota et al. | 360/46 |
| 4,984,099 | 1/1991 | Kanota et al. | 360/46 |
| 5,166,955 | 11/1992 | Ohta | 360/65 |
| 5,255,128 | 10/1993 | Inoue et al. | 360/51 |
| 5,258,933 | 11/1993 | Johnson et al. | 364/602 |
| 5,265,125 | 11/1993 | Ohta | 360/65 |

OTHER PUBLICATIONS

Wood, Ahlgrim, Hallamasek, Stenerson: "An Experimental Eight–Inch Disc Drive with One–Hundred Megabytes Per Surface", *IEEE Trans. on Magnetics.*, vol. MAG–20, No. 5, Sep. 1984, pp. 698–702.

Dolivo, F., Schott, W., Ungerbock, G. "Fast Timing Recovery for Partial–Response Signalling Systems", Conference Record, ICC 89, IEEE Jun. 1989 pp. 573–577.

Thapar, H. K., Patel, A. M. "A Class of Partial Response Systems for Increasing Storage Density in Magnetic Recording", IEEE Transactions on Magnetics, vol. Mag–23, No. 5 Sep. 1987 pp. 3666–3668.

Cideciyan, R. Dolivo, F., Hermann, R., Hirt, W., Schott, W. "A PRML System for Digital Magnetic Recording", IEEE Journal on Selected Areas in Communications, vol. 10, No. 1 Jan. 1992 pp. 38–56.

*Primary Examiner*—N. Chris Kim
*Attorney, Agent, or Firm*—David B. Harrison

[57] ABSTRACT

A simplified architecture is provided for a partial response read channel. One digital equalizer is used in conjunction with a simple shaping circuit to minimize power consumption while concurrently optimizing both the data recovery and timing extraction functions.

9 Claims, 3 Drawing Sheets

OPTIMIZED EQUALIZER SYSTEM FOR DATA RECOVERY AND TIMING EXTRACTION IN PARTIAL RESPONSE READ CHANNELS

REFERENCE TO RELATED APPLICATION

This is a continuation of U.S. patent application Ser. No. 08/123,502 filed on Sep. 17, 1993, now abandoned.

BACKGROUND OF THE INVENTION

This invention relates to data storage systems and more particularly to the reading of information from a rotating medium.

The data storage density of the magnetic and optical recording systems has increased dramatically. Presently most systems use run-length limited (RLL) coding and peak detection (PD) to achieve high reliability and high storage densities. More advanced techniques consisting of partial response (PR) signaling and maximum-likelihood sequence detectors (MLSD) or Viterbi detectors allow further increases in density.

While the MLSD or Viterbi detector provides an effective way to recover data from a readback signal, a Viterbi detector without an equalizer is usually too complex to implement, since the complexity of a Viterbi detector grows exponentially with the number of encoded cells which are interfering with one another.

In the past separate equalizer circuits were used for both the timing extraction and data recovery functions. Use of separate equalizers allows the timing function and the data recovery function to be optimized separately; however, two separate equalizers consume roughly twice the power of one equalizer. If only one equalizer is used, a tradeoff is required in one of the functions resulting in a less than desirable performance for the other function.

What is needed in the art is a low cost and lower power system which is optimized for both the data recovery and the timing extraction functions.

SUMMARY OF THE INVENTION

It is an object of the invention to provide a partial response channel which has low cost and lower power consumption.

It is another object of the invention to provide a partial response read channel which can account for a variety of recording densities.

It is a feature of the invention to provide a partial response channel having only one equalizer that supplies its output to both a timing extraction circuit and a data recovery circuit.

It is an advantage of the invention to provide a partial response read channel which can be incorporated into a rotating recording system and provide for a variety of different recording densities.

Additional objects, features and advantages of the invention will be set forth in part in the description which follows, and in part will be obvious from the description or may be learned from the practice of the invention. To achieve the objects, features and advantages and in accordance with the purpose of the invention, a partial response read channel system is provided for reading data from a rotating medium. The partial read channel includes a sampler responsive to a readback waveform. The sampler's output is provided to a single digital equalizer which shapes the sampled signals to a first target waveform. The first target waveform is provided to a timing extraction circuit which provides an encoded clock rate and enabling signals to the sampler. A shaping circuit implementing the equation $(1+D)^{\wedge}(n-m)$ is also responsive to the first target waveform and provides a second target waveform which is used for data recovery.

BRIEF DESCRIPTION OF THE DRAWINGS

This invention is pointed out with particularity in the appended claims. The above and further objects, features and advantages of the invention may be better understood by referring to the following descriptions taken in conjunction with the accompanying drawings, in which:

DETAILED DESCRIPTION OF AN ILLUSTRATIVE EMBODIMENT

Figure 1:
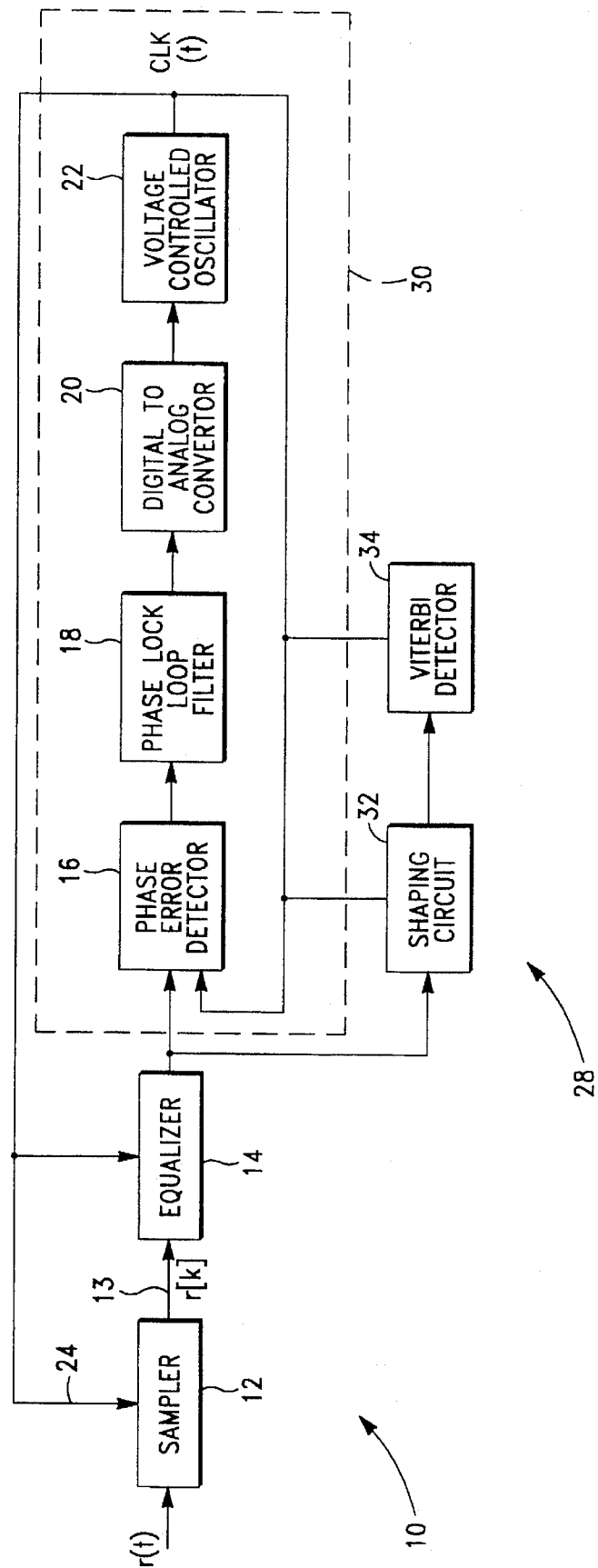
FIG. 1 is a functional block diagram of a partial response read channel constructed in accordance with the invention.

With reference to FIG. 1, a partial response channel subsystem 10 constructed in accordance with the invention is shown. A continuous waveform readback signal r(t) is provided to a sampler 12. This readback signal may be generated, for example, by information from a suitable source such as an optical or magnetic disk (not shown) which is sensed by a transducer (not shown). In the preferred embodiment, the readback signals are the sensed, encoded data stored in the rotating medium. Sampler 12 is a device which transfers its input signal value at an enabled instant to its output on line 13. Thus, the function of sampler 12 in the embodiment shown in FIG. 1 is to convert an analog waveform into a sequence of sample value signals r[K]. Sampler 12 provides a series of sample value signals one data cell time apart to a digital equalizer circuit 14.

In actual operation the read channel isolated transition response (ITR) at readback signal r(t) is not an ideal signal but rather is a signal whose time domain shape is only roughly known. The function of equalizer 14 is to transform the nonideal ITR signals into a more desirable target ITR or, more simply, a target waveform. Equalizer 14 may be any number of circuits; however, in the preferred embodiment in FIG. 1, it is implemented as a finite impulse response (FIR) filter which transforms as closely as it can the readback signal r(t) to a desired partial response channel shape. A full response channel has an ITR which is all zeroes except for one sampling instant. A partial response channel has an output from an equalizer which has more than one nonzero sampling output.

In the current embodiment, the partial response channel retains a controlled amount of intersymbol interference while transforming the readback signal as closely as possible to a target output. This target output has the form $(1-D)*(1+D)^{\wedge}m$, where D is a unit delay operator and m is an integer. For example with m=1, the polynomial yields $(1-D)*(1+D)$, which reduces to $(1-D^2)$ for a PR Class IV spectrum equalization; for m=2, the polynomial reduces to $(1+D-D^2-D^3)$ for an EPR Class IV spectrum equalization. Each value of m will produce a different target output. M is selected based on the density of the data in the rotating storage medium with the higher the value of m, the greater the density. The ITR at the output of the equalizer 14 is a series of signals which is as close as possible to the target ITR.

The output of equalizer 14 is provided to a timing extraction circuit comprising a phase-locked loop (PLL) subsystem 30. PLL subsystem includes phase error detector 16, phase-locked loop filter 18, digital to analog converter 20 and voltage control oscillator (VCO) 22. PLL subsystem 30 establishes bit synchronization, i.e., it provides a clock signal clk(t) which is phase locked to the encoded data bit stream contained in the readback signal r(t). The clock signals from PLL subsystem 30 are used as the basis for the system clock for the digital data recovery subsystem.

The output of PLL subsystem 30 provides one sampling instant for each encoded data bit. Thus PLL subsystem 30 creates a sampling clock signal CLK (t) on a path 24 which is phase-locked to the equalizer 14 output signal, and thus is also phase-locked to the disk readback signal.

Phase error detector 16 has two inputs, one from equalizer 14 and a second from the VCO 22 over the line 24. Detector 16 measures the difference in phase between the clock output from VCO 22 and the output signals from equalizer 14 and provides a signal to filter 18 whose value is approximately proportional to the difference between the VCO's 22 clock phase and the phase of the signal at the equalizer 14 output. PLL filter 18 provides its output to convertor 20. Digital to analog converter 20 may be a well known circuit which transforms digital signals into an analog value. The output of converter 20 is a voltage level which enables the voltage controlled oscillator (VCO) 22 to vary its frequency over a selected frequency range. The output of VCO 22 is clock signal clk(t) which is used by the data storage system. In a magnetic disk implementation, the clock frequency created by PLL subsystem 30 is based on the speed of the disk and the number of bits per cylinder.

VCO 22 also provides an enabling clk(t) signal over line 24 to sampler 12. A sample value of signal r(t) is transferred by sampler 12 to line 13 over each period of clock signal clk(t).

The output of equalizer 14 is also provided to a data recovery circuit 28 which includes a shaping circuit 32 and a Viterbi detector 34. Shaping circuit 32 transforms the output from equalizer 14 into a second target waveform which can be used by the Viterbi detector 34. The shaping circuit can be mathematically represented by the formula $(1+D)^{(n-m)}$ where n is a parameter to control the target shape for the data recovery function and m is another parameter selected to shape the timing extraction function. Equalizer 14 target output is $(1-D)*(1+D)^m$ and the Viterbi detector input is $(1-D)*(1D)^n$.

With higher recording densities, a higher value of n may be needed for data recovery. For example, for a Lorentzian readback signal operated at a normalized density of 3.0, the data recovery performance of the n=3 partial response channel at a given data cell error rate is about 5.5 dB better in signal-to-noise (SNR) than the n=1 partial response channel.

Figure 4:
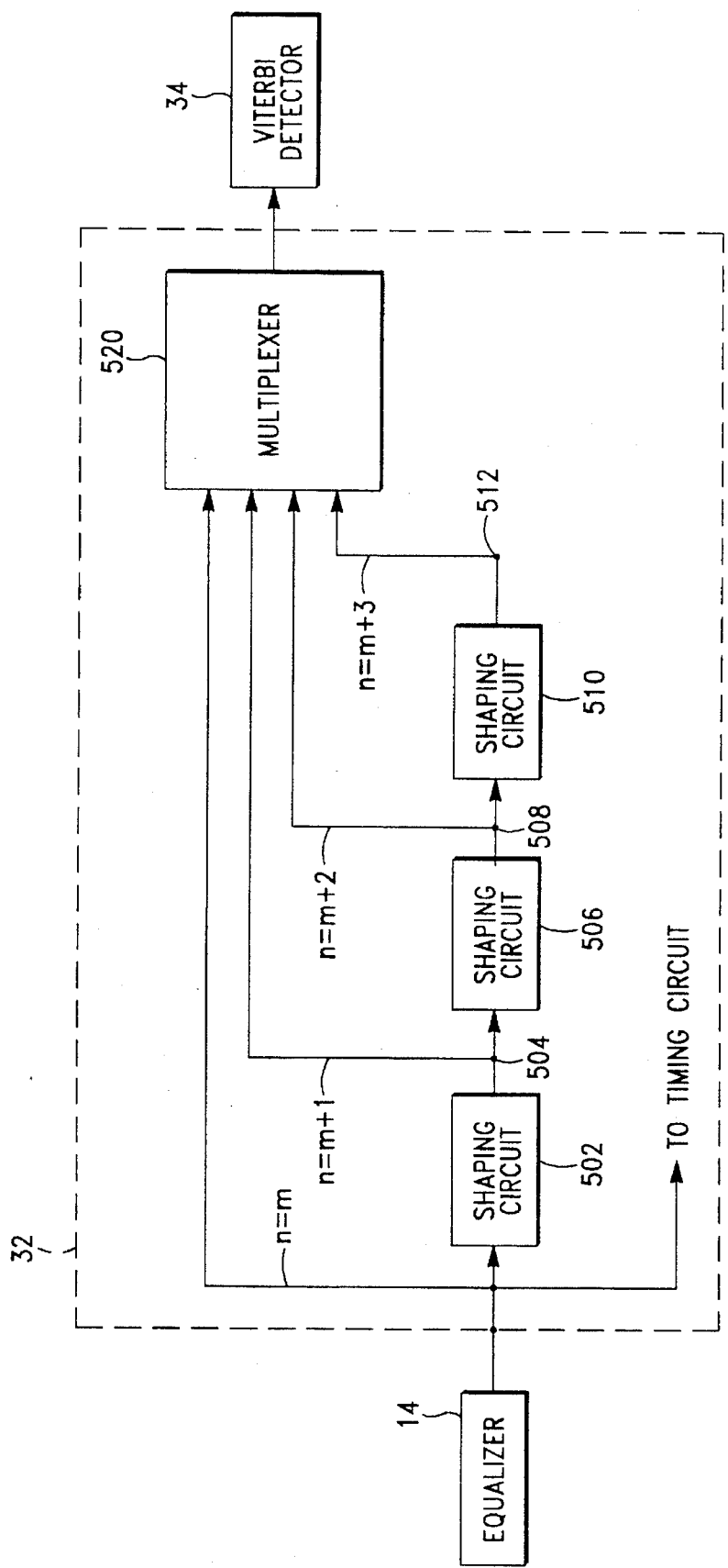
FIG. 4 is a block diagram of the preferred implementation of a data recovery circuit having cascaded shaping circuits.

In the present invention, shaping circuit 32 is a simple circuit when compared to the equalizer which it replaces. The function of shaping circuit 32 is to provide a target waveform in a shape suitable for detection by a Viterbi detector. In the preferred embodiment a number of shaping circuits 32 can be serially cascaded to provide design flexibility as well as circuit simplicity. For example, if densely packed information is to be read, a series of three cascaded shaping circuits 502, 506, 510, as shown in FIG. 4 may be desirable; if a less dense optical disk is being read, only one shaping circuit may be necessary.

The output of shaping circuit 32 is provided to Viterbi detector 34 which generates data signals corresponding to the information from the rotating medium. In general, a Viterbi detector 34 receives the shaped signals and, based on its knowledge of signal patterns, provides a data output which identifies the bit value read from the media. Thus Viterbi detector 34 is sensitized to the target waveform to determine when a data bit as a binary 1 or a binary 0 has been read. The Viterbi detector 34 provides this as an output. Examples of this function are described in IEEE Journal on Selected Areas in Communications, Cideciyan et al, Vol. 10 No. 1, January 1992, and G. D. Forney, Jr. "The Viterbi Algorithm", Proceedings of the IEEE, Vol. 61 No. 3, March 1973.

Figure 2:
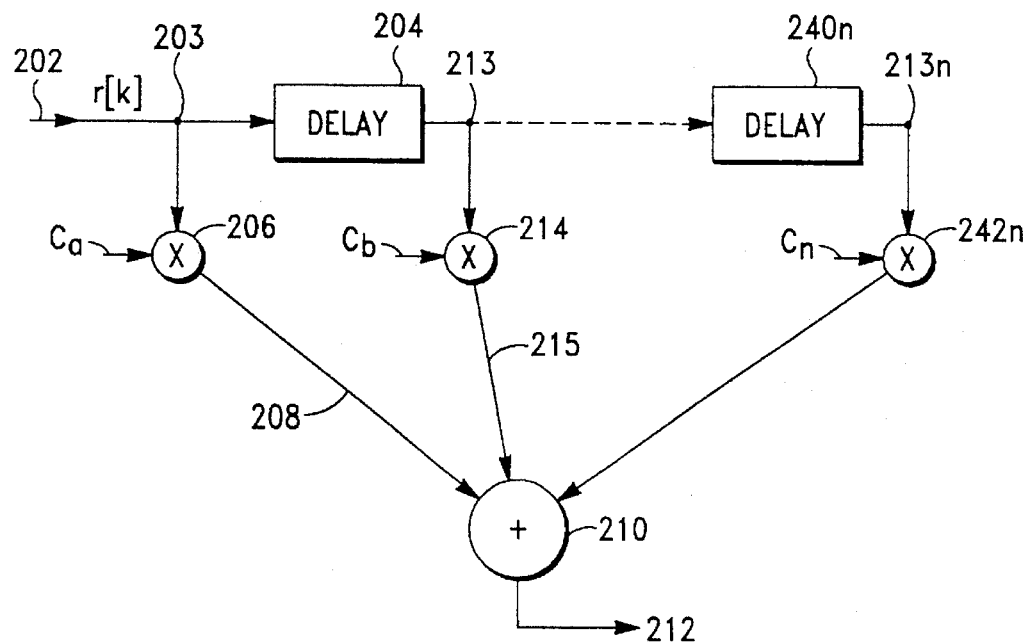
FIG. 2 is a block diagram of a simplified equalizer circuit 14 used in FIG. 1.

One example of a finite impulse response (FIR) filter used as an equalizer 14 is more fully shown in FIG. 2. As described previously, equalizer 14 receives an input signal from sampler 12 (FIG. 1). This input signal is provided over line 202 to node 203. Multiplying circuit 206 is connected to node 203 and has as a second input signal Ca.

The values of Ca to Cn can be fixed when a fairly limited range of signals is provided; Ca to Cn can also be adapted to have different values if the ITR from summing circuit 210 is not within an appropriate range. A conventional least mean square (LMS) algorithm can be used for optimizing Ca through Cn.

Multiplying circuit 206 multiplies the signal from node 203 times Ca and provides the output over line 208. Thus Ca modifies the value of the signal from node 203. The output of multiplying circuit 206 is provided over line 208 to summing circuit 210. Summing circuit 210 provides an output signal 212 to the timing extraction circuit and the data recovery circuit.

Node 203 is also coupled to a delay element 204. Delay element 204 provides a time delay equal to one encoded data bit cell duration. A second node 213 receives the output of delay element 204 and transfers the signal into multiplying circuit 214. Multiplying circuit 214 also receives an input from amplitude modifier Cb and provides an output over line 215 into summing circuit 210.

In a similar manner, a number of delay elements 240n and additional nodes may be coupled between node 213 and node 223n. A multiplying circuit $242_n$ multiplies a signal at node $223_n$ at the output of each delay element $240_n$ with an amplitude modifier signal $C_n$. Multiplying circuit 242n, provides an output signal to summing circuit 210. The output of circuit 210 is the target waveform. Thus equalizer 14 shapes the input signals to the target $(1-D)*(1+D)^m$ as closely as possible.

Equalizer 14 works as follows. For purposes of discussion, it is assumed that only two delay elements are used in equalizer 14. At signal 1, i.e. the value of r(t) at an initial clock signal, summing circuit 210 provides an output signal 212 equal to signal 1 times Ca. At signal 2, i.e. the r(t) signal one time period later, summing circuit 210 provides an output signal 212 equal to signal 1 times Cb plus signal 2 times Ca. At signal 3, summing circuit 210 provides an output signal 212 equal to signal 1 times Cn plus signal 2 times Cb plus signal 3 times Ca. When signal 4 is present, signal 1 would no longer figure in the output; the output signal 212 would be signal 4 times Ca plus signal 3 times Cb plus signal 2 times Cn.

Figure 3:
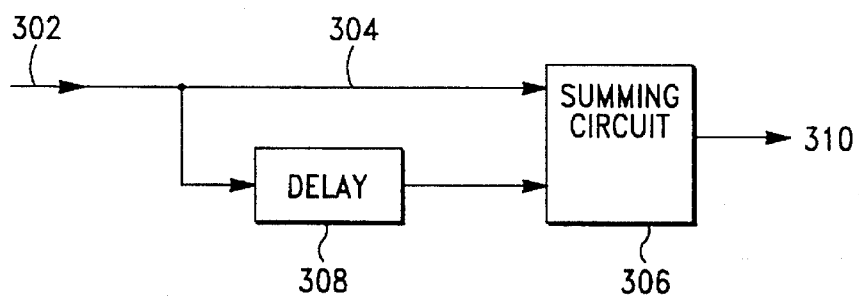
FIG. 3 is a block diagram of a delay circuit used in shaping circuit 32 shown in FIG. 1.

FIG. 3 shows a simple shaping circuit 32 as used in this invention. Shaping circuit 32 is equal to the algebraic expression (i+D) and comprises input 302 which is directly coupled through wire 304 into summing circuit 306. Parallel to wire 304 is delay element 308 which provides a time delay equal to one encoded data bit cell duration which is one clock duration. Upon receiving a signal over input 302, summing circuit 306 will provide two output signals over line 310, one clock period apart.

FIG. 4 shows the shaping circuit 32 of FIGS. 1 and 3 in a cascaded configuration. In a preferred embodiment, shaping circuit 32 may have a number of discrete shaping circuits 502, 506, 510. Each of the discrete shaping circuits may be used in one chip. Depending on the density of the media being read, selected waveforms can be generated without having to replace the chip.

Node 500 receives the target waveform provided by equalizer 14. The output of node 500 is also connected to a multiplexer 520 whose output, when selected, is provided to Viterbi detector 34. Node 500 transfers a target waveform to multiplexer 520 where n=m. A first shaping circuit 502 is coupled between nodes 500 and 504. Shaping circuit 502 is identical to the circuit shown in FIG. 3. Node 504 is also connected to multiplexer 520 and transfers a target waveform to multiplexer 520 where n=m+1. A second shaping circuit 506 is coupled between node 504 and node 508. Node 508 transfers a target waveform to multiplexer 520 where n=m+2. Additional cascaded circuits may also be used. By programming which input to multiplexer 520 is selected, one of a set of waveforms is created at the input to the Viterbi detector 34. The usefulness of the cascaded shaping circuits selectable by multiplexer 520 may be seen in the following example.

A 3.5 inch disk having 1 gigabyte of data may be replaced in the future by a 3.5 inch disk having 4 gigabytes. To accurately read this data, it may be necessary to use a higher value of n. By having the serially cascaded circuits 502, 506, 510, the control needed to give a desired output exists. Moreover, the serially cascaded circuits enable significant flexibility for a partial response read channel.

The foregoing description has been limited to a specific embodiment of the invention. It will be apparent, however, that variations and modifications may be made to the invention. For example, an analog equalizer may be used in place of the digital equalizer provided herein, the sole changes that are necessary are the interposition of the analog equalizer at the output of the readback signal with the output of the analog equalizer going to the sampler; in all other respects the circuit would be the same.

It is the object of the appended claims to cover all such variations and modifications as come within the spirit and scope of the invention.

What is claimed as new and desired to be secured by Letters Patent of the United States is:

1. In a magnetic recording system, a partial response playback channel comprising:

a sampler circuit which periodically samples a playback analog input data signal r(t) at a predetermined data cell rate in accordance with a data cell clock signal and produces incoming signal samples r, a partial-response equalizer connected to receive signal samples r from the sampler circuit and being configured to generate a first equalized data signal sample stream from the incoming signal samples r according to a polynomial $(1-D)*(1+D)^m$, where m is a positive integer in a range of 0–2 and D represents a data cell unit delay interval;

a shaping circuit coupled to said equalizer and comprising a plurality of cascaded shaping elements each configured to generate a shaped output signal from its input signal according to a polynomial (1+D), the shaping circuit configured to generate a second equalized data signal sample stream from said first equalized data signal sample stream according to a polynomial $(1+D)^{n-m}$, where n is a positive integer greater than m and not greater than five, and selection means for selecting from among the outputs of two or more of said cascaded shaping elements as the source of said second equalized data signal;

a digital data decoder coupled to said shaping circuit to recover from said second equalized data, signal sample stream a digital data bit stream represented by said playback analog input data signal; and a timing extraction circuit coupled to said equalizer to generate from said first equalized data signal sample stream the data cell clock signal synchronized to said playback analog input data signal and having a well-known phase relationship therewith, said data cell clock signal providing a timing reference for controlling timing of said sampler circuit, said equalizer, said shaping circuit, and said decoder.

2. In a magnetic recording system, a partial response channel comprising:

means for providing first signals corresponding to information detected from said recording system, first shaping means responsive to said first signals for providing second signals corresponding to a first target waveform used for timing extraction, and second shaping means responsive to said second signals for providing third signals corresponding to a second target waveform used for data recovery, said second shaping means comprising a plurality of cascaded shaping circuits, each of said cascaded shaping circuits connected serially to said second signals, each of said cascaded circuits comprising delay means for providing a one bit time delay, and summing means responsive to said delay means and said serial output from either said second signals or a previous cascaded circuit for providing said second target waveform, and selection means coupled to the output of said first shaping means and each of said plurality of cascaded circuits for selecting said second target waveform in response to the characteristics of said recording system.

3. A partial response within a magnetic recording system as defined in claim 2, and further comprising:

sampling means coupled to said means for providing first signals for receiving an analog waveform identifying the information from said recording system, and means responsive to said second target waveform for providing data recovery signals identifying the information received by said sampling means.

4. A partial response channel within a magnetic recording system as defined in claim 3 wherein said first shaping means is an equalizer which is responsive to the value of said first signals, said equalizer providing said first target waveform comprising a series of discrete output signals corresponding to the analog waveform provided by said receiving means.

5. A partial response channel within a magnetic recording system as defined in claim 4 and further comprising:

a phase-locked loop subsystem responsive to said second signals for generating clock signals to the recording system and enabling signals to said sampling means.

6. An apparatus for reading data from a magnetic storage media, said apparatus including a partial response playback channel and comprising:

means for providing an analog waveform corresponding to the data on said media, sampling means for providing sample value signals, equalizer means responsive to said sample value signals for generating first target output signals substantially corresponding to said analog waveform, timing means responsive to first target output signals for generating clock signals, and data recovery means responsive to the first target output signals and said clock signals for generating data signals corresponding to the information read from said storage media and including:

a plurality of cascaded shaping circuits responsive to the output of said equalizer means, each shaping circuit for providing a unique one of a plurality of second target output signals, a multiplexer coupled to select one of said plurality of second target output signals, and detection means responsive to said multiplexer for generating data signals identical to the information read on said media.

7. An apparatus as defined in claim 6 wherein each of said shaping circuits comprising a node coupled to said multiplexer, a delay for providing a time delay of one time unit, and a summing circuit for adding said serially connected signals with the output of said delay to provide a modified series of signals.

8. An apparatus as defined in claim 6 wherein said timing means comprises:

a phase locked loop subsystem including means responsive to said first target output signals and said clock signals for modifying the frequency and phase of said series of clock signals, and means responsive to said clock signals for enabling said sampling means to transfer said sample value signals to said equalizer means.

9. An apparatus as defined in claim 6 wherein said timing means further includes:

a phase error detector responsive to said first target output signals and said series of clock signals for providing an output proportional to the difference between the phase of said first target output signals and said clock signals, a phase locked loop filter responsive to said phase detector output error for providing a filtered signal, a digital to analog converter responsive to said phase locked loop filtered signal for providing an analog control voltage, and a voltage controlled oscillator controlled by said analog control voltage for providing said series of said clock signals.

* * * * *